United States Patent
Fujita

(10) Patent No.: US 8,300,474 B2
(45) Date of Patent: Oct. 30, 2012

(54) NONVOLATILE SEMICONDUCTOR MEMORY

(75) Inventor: Norihiro Fujita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/298,610

(22) Filed: Nov. 17, 2011

(65) Prior Publication Data

US 2012/0239984 A1    Sep. 20, 2012

(30) Foreign Application Priority Data

Mar. 18, 2011    (JP) ................................ 2011-061553

(51) Int. Cl.
*G11C 11/34*    (2006.01)

(52) U.S. Cl. ......... 365/185.22; 365/185.12; 365/185.03; 365/185.17; 365/185.19; 365/185.21; 365/185.23; 365/185.24

(58) Field of Classification Search ............. 365/185.12, 365/185.03, 185.17, 185.19, 185.21, 185.22, 365/185.23, 185.24
See application file for complete search history.

(56) References Cited

U.S. PATENT DOCUMENTS

| | | | |
|---|---|---|---|
| 5,691,941 A | 11/1997 | Imamiya et al. | |
| 5,917,756 A | 6/1999 | Imamiya et al. | |
| 5,959,895 A | 9/1999 | Imamiya et al. | |
| 6,058,046 A | 5/2000 | Imamiya et al. | |
| 6,172,911 B1 * | 1/2001 | Tanaka et al. | 365/185.22 |
| 6,907,497 B2 | 6/2005 | Hosono et al. | |
| 2009/0323432 A1 | 12/2009 | Futatsuyama et al. | |
| 2011/0128790 A1 * | 6/2011 | Sarin et al. | 365/185.19 |
| 2012/0176843 A1 * | 7/2012 | Kalavade et al. | 365/185.19 |

FOREIGN PATENT DOCUMENTS

JP    2010-9733    1/2010

* cited by examiner

*Primary Examiner* — Fernando Hidalgo

(74) *Attorney, Agent, or Firm* — Oblon, Spivak, McClelland, Maier & Neustadt, L.L.P.

(57) ABSTRACT

According to one embodiment, a nonvolatile semiconductor memory includes a control circuit. The control circuit is configured to repeat an application of a write pulse and a verify read operation to a selected word line, perform a read operation from a selected memory cell after storing of program data is judged to be completed by a verify circuit, and output a status information indicating that a program operation has passed to a external controller when data read by a read operation and a program data match and the status information indicating that the program operation has failed to the external controller when both do not match. A data latch circuit continues to latch the program data even after the storing of the program data is judged to be completed by the verify circuit.

20 Claims, 9 Drawing Sheets

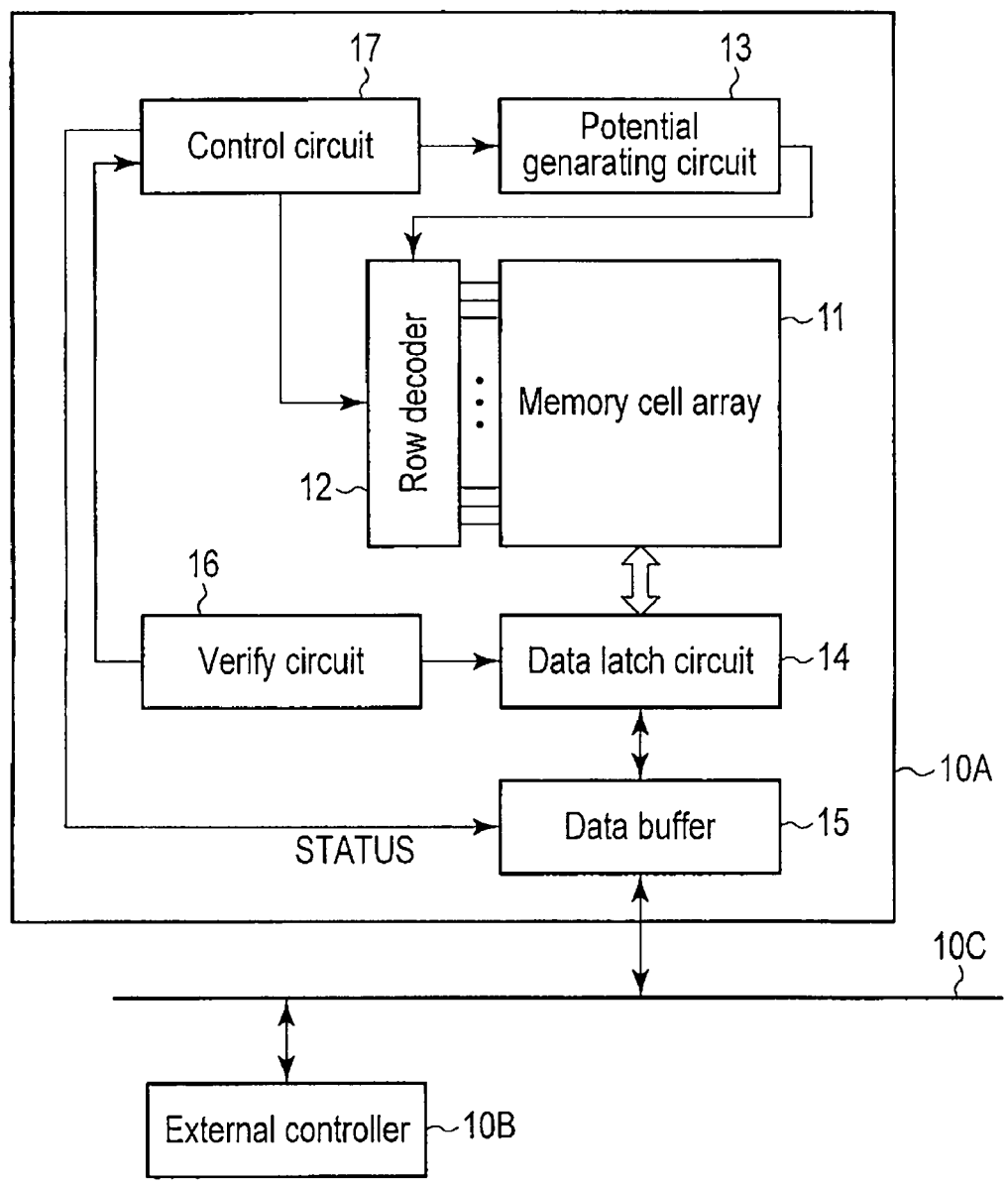
F I G. 1

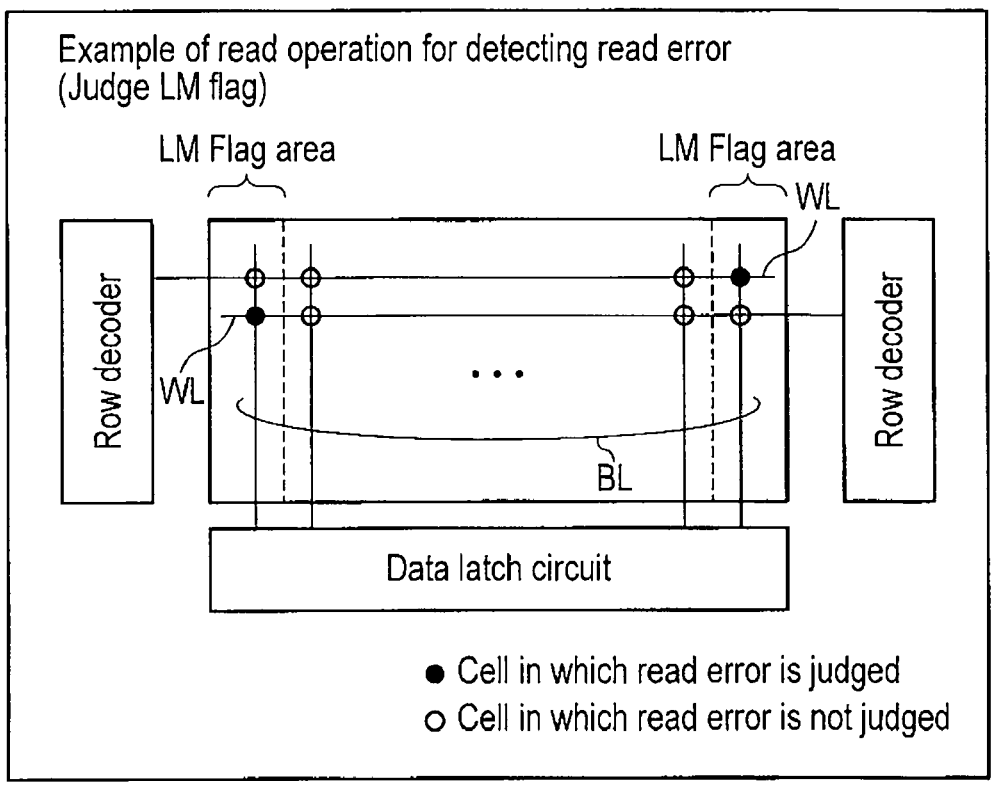
F I G. 7

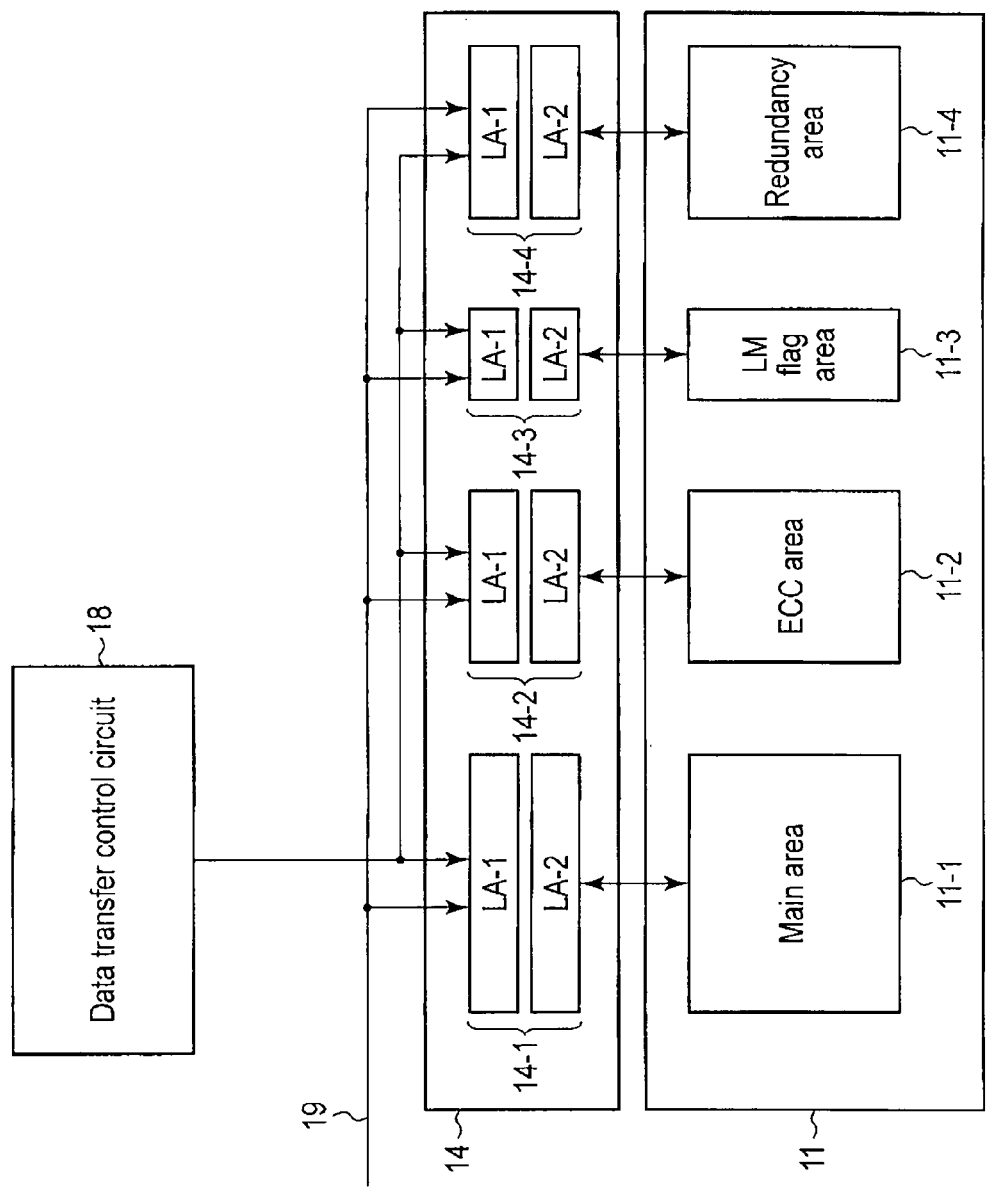
F I G. 10

NONVOLATILE SEMICONDUCTOR MEMORY

CROSS-REFERENCE TO RELATED APPLICATIONS

This application is based upon and claims the benefit of priority from prior Japanese Patent Application No. 2011-061553, filed Mar. 18, 2011, the entire contents of which are incorporated herein by reference.

FIELD

Embodiments described herein relate generally to a nonvolatile semiconductor memory.

BACKGROUND

In recent years, as a result of micropatterning of nonvolatile semiconductor memories, occurrences of the error mode such as increased resistance of word lines after product shipment have been confirmed.

When a word line is totally broken, a nonvolatile semiconductor memory cannot execute a program normally and thus can let an external controller know of such error (status fail) through a program verify operation. Therefore, the external controller can instruct a program operation again after taking steps, for example, changing the word line.

However, when a subtle increase in resistance of a word line in which, for example, the program verify operation can normally be performed, but a read operation cannot be normally performed occurs, the program verify operation terminates (status pass) and the program is judged to have been executed normally and thus, the external controller no longer holds program data. Therefore, if a read operation is performed thereafter, data cannot be read from the nonvolatile semiconductor memory and the program operation cannot be performed again either, resulting in a system error.

BRIEF DESCRIPTION OF THE DRAWINGS

FIG. 1 is a diagram showing a memory system according to an embodiment;

FIG. 3, FIG. 4, FIG. 5, FIG. 6 and FIG. 7 are diagrams showing a read operation before the program operation terminates;

FIG. 10 is a diagram showing a memory cell array core unit; and

DETAILED DESCRIPTION

Figure 2:
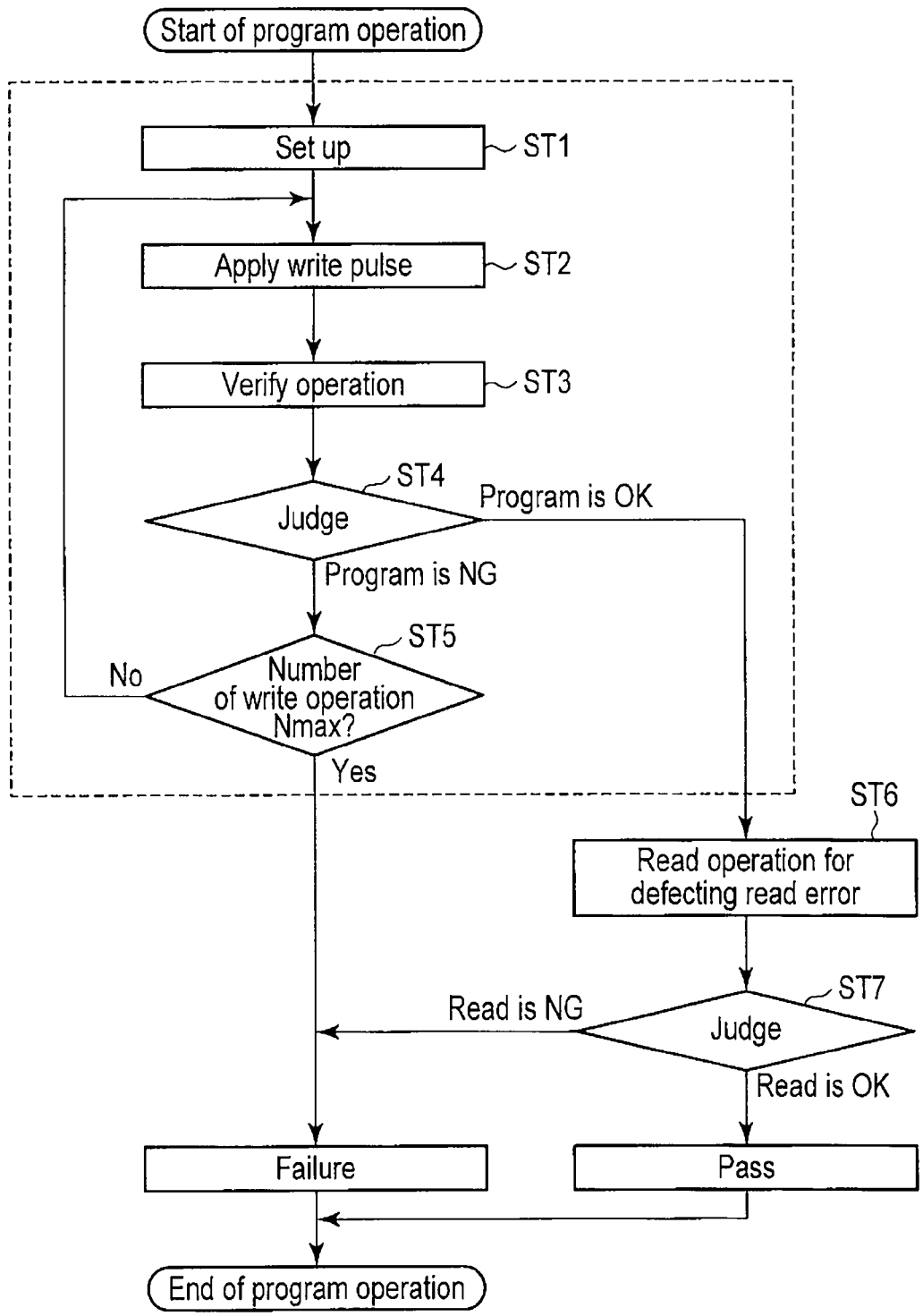
FIG. 2 is a flow chart of a program operation.

In general, according to one embodiment, a nonvolatile semiconductor memory comprising: a memory cell array including a selected memory cell as a target of a program operation; a row decoder that selects a selected word line connected to the selected memory cell; a data latch circuit that latches program data stored in the selected memory cell; a verify circuit that judges completion/non-completion of storing of the program data in the selected memory cell; and a control circuit that outputs status information to an external controller before the program operation terminates, wherein the control circuit is configured to: repeat an application of a write pulse and a verify read operation to the selected word line, perform a read operation from the selected memory cell after the storing of the program data is judged to be completed by the verify circuit, and output the status information indicating that the program operation has passed to the external controller when data read by the read operation and the program data match and the status information indicating that the program operation has failed to the external controller when both do not match, wherein the data latch circuit continues to latch the program data even after the storing of the program data is judged to be completed by the verify circuit.

1. Embodiment

The embodiment proposes a technology to judge whether there is any error (read error) such as being unable to read data of a program after the program having been executed normally before a program operation terminates. The program operation includes an operation that does not change the threshold in accordance with program data (write inhibited) and an operation that increases the threshold (write enabled). A simple read is assumed to mean a read operation after program completion and does not include a read operation (verify read) during verify operation to judge whether a program is completed. From an operational point of view, a read operation differs from a verify operation, thus both operations will be described below.

FIG. 1 shows a memory system according to an embodiment.

Nonvolatile semiconductor memory (for example, a NAND flash memory) 10A and an external controller (for example, a NAND controller) are mutually connected via data bus 10C. External controller 10B controls a program operation of nonvolatile semiconductor memory 10A.

Memory cell array 11 comprises a selected memory cell as a target of a program operation. Row decoder 12 selects a selected word line to be connected to the selected memory cell. Potential generating circuit 13 generates a high potential (program potential) applied to the selected word line in a program operation.

Data latch circuit 14 latches program data to be stored in the selected memory cell. Data buffer 15 functions as an interface circuit of data input/output of nonvolatile semiconductor memory 10A. Verify circuit 16 judges completion/non-completion of storing of program data to the selected memory cell.

Control circuit 17 outputs status information STATUS to external controller 10B before a program operation terminates based on a judgment result by verify circuit 16.

FIG. 2 shows a program operation by control circuit 17 in FIG. 1.

If external controller 10B instructs nonvolatile semiconductor memory 10A to perform a program operation, control circuit 17 first sets up the program operation (such as resetting registers and activating a charge pump circuit) (step ST1).

Next, control circuit 17 applies a write pulse to the selected word line connected to the selected memory cell as a target of the program operation and performs a program operation of the selected memory cell (step ST2). For "1" programming, the channel potential of the selected memory cell is boosted by the application of the write pulse so that a write operation (threshold rise) is inhibited. For "0" programming, the channel potential of the selected memory cell is fixed to 0 V during application of a write pulse so that a write operation (threshold rise) is executed.

Whether to boost or fix to 0 V the channel potential of the selected memory cell is judged based on program data latched into data latch circuit 14. If, for example, data latched into data latch circuit 14 is "1", the channel potential of the selected memory cell can be boosted by transferring a positive potential to a channel of the selected memory cell. If data latched into data latch circuit 14 is "0", the channel potential of the selected memory cell can be fixed to 0 V by transferring 0 V to a channel of the selected memory cell.

Then, a verify operation (verify read) to judge completion/non-completion of storing of program data to the selected memory cell is performed (steps ST3 to ST5). In the verify operation, whether the threshold of the selected memory cell of "0" programming is larger than the verify read potential is judged.

If the threshold of the selected memory cell is smaller than the verify read potential, storing of program data is not completed and thus, the application of a write pulse is executed again. If the threshold of the selected memory cell is larger than the verify read potential, storing of program data is completed and thus, data latched into the data latch circuit is changed from "0" to "1" so that a write operation should not be performed again.

If the selected memory cell can store n (n is a natural number equal to 2 or greater) bits (2n levels) and store s upper bits excluding lower bits, a verify read potential having levels is used for a verify read. Which of the levels is to be used as a reference is judged based on the value of the lower bit stored in the selected memory cell and the value of the upper bit to be stored.

When storing of program data in all selected memory cells as targets of the program operation connected to the word line is completed, all data latched into data latch circuit 14 changes to "1" and verify circuit 16 notifies control circuit 17 of program completion.

According to the conventional technology, the program operation by control circuit 17 ends here (inside a broken line in FIG. 2). Therefore, if verify circuit 16 judges that storing of program data is completed, control circuit 17 outputs status information STATUS (pass) indicating that the program operation has passed to external controller 10B. If verify circuit 16 judges that storing of program data is not completed even if the write count reaches maximum value Nmax, control circuit 17 outputs status information STATUS (failure) indicating that the program operation has failed to external controller 10B.

Under such circumstances, however, an error of a subtle increase in resistance of a word line such as being able to perform a program operation normally and unable to perform a read operation normally cannot be detected.

Thus, in the embodiment, after verify circuit 16 judges that storing of program data is completed (after program verify has passed), a read operation from the selected memory is performed to detect a read error (steps ST6 and ST7).

In the read operation, whether data stored in the selected memory cell is "1" or "0" is judged based on the read potential. If, for example, the threshold of the selected memory cell is smaller than the read potential, data stored in the selected memory cell is judged to be "1". If the threshold of the selected memory cell is larger than the read potential, data stored in the selected memory cell is judged to be "0".

If the selected memory cell can store n (n is a natural number equal to 2 or greater) bits (2n levels) and 2 bits (4 levels) or more are stored in the selected memory cell, a read potential having levels is used for read operation. By using the levels, all n bits (2n levels) stored in the selected memory cell can be read.

If data read by the read operation and program data match, control circuit 17 judges that there is no read error and outputs status information STATUS (pass) indicating that the program operation has passed to external controller 10B. If both data do not match, control circuit 17 judges that a read error has occurred and outputs status information STATUS (failure) indicating that the program operation has failed to external controller 10B.

That is, according to the embodiment, status information STATUS transferred from nonvolatile semiconductor memory 10A to external controller 10B is a combination of information indicating whether a program has been executed successfully and information indicating whether a read error has occurred.

Therefore, whether there is any error of a subtle increase in resistance of a word line such as being able to perform a program operation normally and unable to perform a read operation normally can be judged before a program operation terminates.

External controller 10B holds program data before a program operation terminates and thus, if an error thereof is detected, the program operation can be performed again after taking steps, for example, changing the word line. Therefore, a problem such as being unable to read permanently data stored by the user in a nonvolatile semiconductor memory will not arise.

Incidentally, as described in the above program operation, when storing of program data in all selected memory cells as targets of the program operation connected to the word line is completed, all data latched into data latch circuit 14 changes to "1". That is, according to the conventional technology, after storing of program data is judged to be completed (after program verify has passed), the data latch circuit does not latch program data.

Thus, in the embodiment, after verify circuit 16 judges that storing of program data is completed, data latch circuit 14 continues to latch program data. This is realized by the following means.

For example, one data latch unit judges completion/non-completion of storing of program data of one selected memory cell and thus, in addition thereto, another data latch unit that continues to latch program data even after storing of program data is judged to be completed is provided for the one selected memory cell.

The latter data latch unit may use an existing circuit as a conventional nonvolatile semiconductor memory or a new one may be added. Program data to detect a read error may also be stored in a storing unit other than data latch circuit 14.

Figure 3:
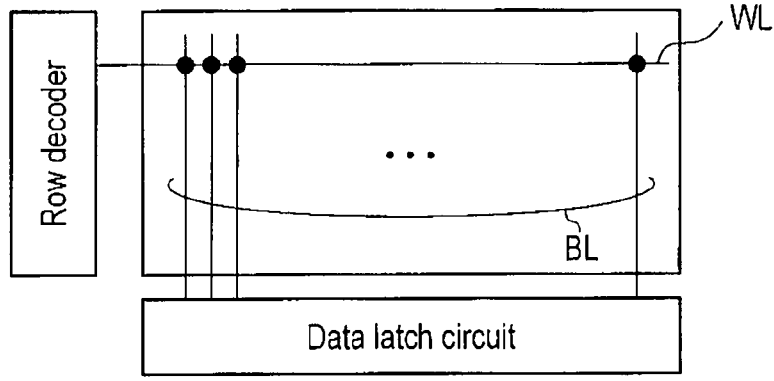

FIG. 3 shows an example of the read operation to detect a read error.

This example corresponds to the read operation in the above program operation.

The read operation is performed on the selected memory cell as a target of the program operation and thus, the judgment of whether there is any read error is performed by comparing read data from the selected memory cell and program data.

However, it is not easy to continue to latch program data after the program verify has passed.

Thus, in consideration of the nature of a read error, an example of the read operation intended for a memory cell (failure judged cell) other than the selected memory cell will be described.

A read error after the program operation is an error such as a subtle increase in resistance of a word line and is likely to occur mainly in a tip portion (when row decoder 12 side serving as a supply source of a high potential is used as a reference) of the word line.

Thus, for example, a failure judged cell is made a reference cell connected to a tip portion of the selected word line and not intended for the program operation. By judging whether data read from the failure judged cell matches an expected value, an increase in resistance (including breaking of wire) of a word line likely to occur at a tip portion of the word line, that is, a read error can be detected.

That is, if both match, status information STATUS indicating that the program operation has passed is output to external controller 10B. If both do not match, status information STATUS indicating that the program operation has failed is output to external controller 10B.

If the failure judged cell is not written into during program operation, the expected value is in an erased state (for example, "1"). The failure judged cell may be, among selected memory cells connected to the selected word line, one or more selected memory cells closest to the tip of the selected word line.

Figure 4:
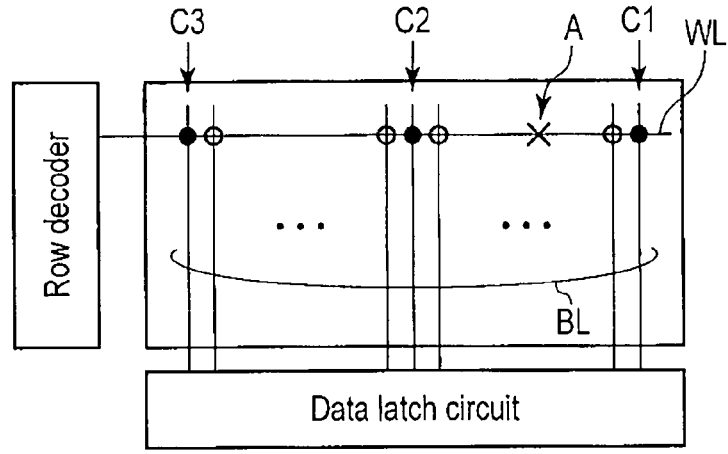

FIG. 4 shows another example of the read operation to detect a read error.

In the present example, first, second, and third failure judged cells are prepared to judge a read error. The first failure judged cell is connected to the tip portion (column C1) of word line WL, the second failure judged cell is connected to the center portion (column C2) of word line WL, and the third failure judged cell is connected to the base portion (column C3) of word line WL.

According to this example, a failure range can be determined.

If, for example, the first failure judged cell (column C1) is not readable and the second and third failure judged cells (columns C2, C3) are readable, breaking portion A of word line WL is assumed between column C1 and column C2. Thus, when such an error occurs, selected memory cells between column C1 and column C2 may be set as status fail and selected memory cells between column C2 and column C3 may be set as status pass.

Figure 5:
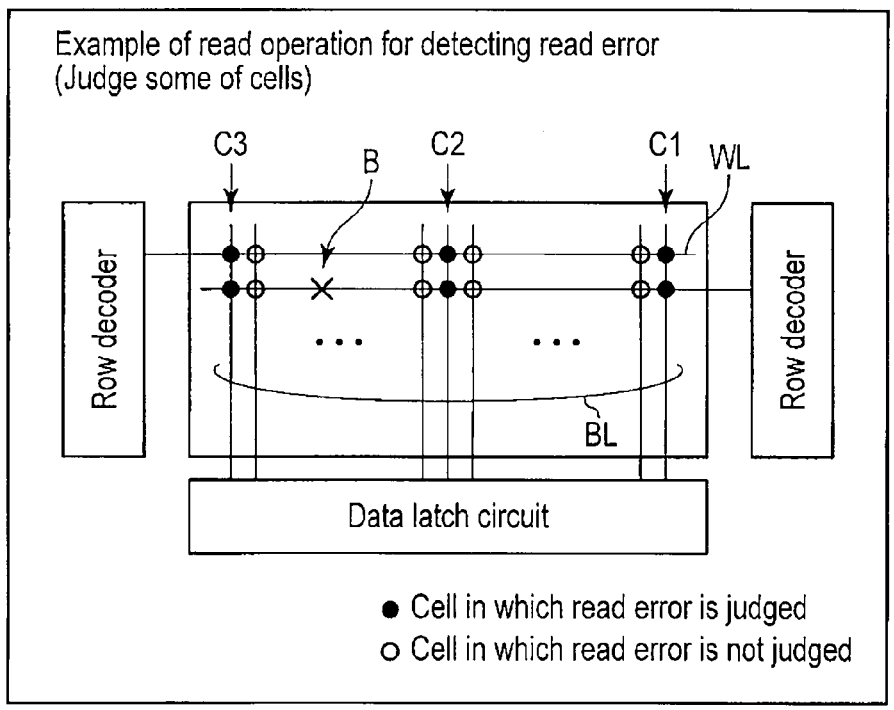

FIG. 5 is a modification of the read operation in FIG. 4.

In this example, a row decoder is arranged at both ends of a memory cell array. If, for example, the row decoder on the right side is used as a reference, the tip portion of word line WL is in column C3, the center portion of word line WL is in column C2, and the base portion of word line WL is in column C1.

If breaking portion B of word line WL is located between column C2 and column C3, according to a technique similar to that in FIG. 4, selected memory cells between column C2 and column C3 may be set as status fail and selected memory cells between column C1 and column C2 may be set as status pass.

Figure 6:
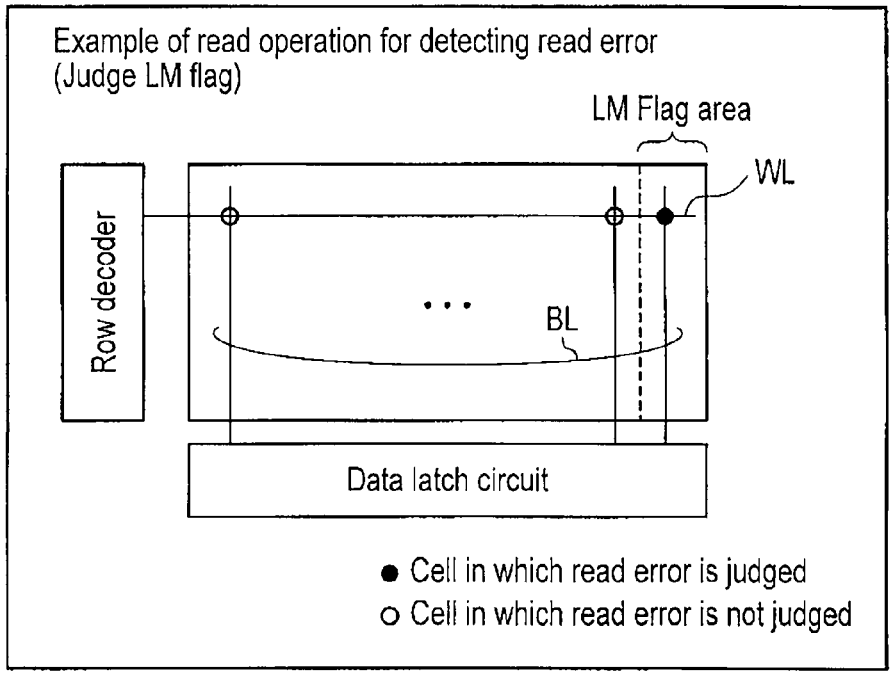

FIG. 6 shows another example of the read operation to detect a read error.

The present example uses a memory cell in an LM (lower middle) flag area existing in 2n (n is a natural number equal to 2 or greater)-level nonvolatile semiconductor memories as a failure judged cell. The LM flag area store s data indicating which of n bits program data represents when the selected memory cell can store n bits (2n levels).

The LM flag area is generally provided in the tip portion of word line WL and thus, reading data thereof and using the data to judge a read error matches with actual conditions that a read error caused by an increase in resistance (including breaking of wire) of a word line is more likely to occur in the tip portion of the word line.

According to this example, a read error can be judged by reading data of a memory cell in the existing LM flag area without providing a dedicated failure judged cell (reference cell) to detect a read error and thus, an increase in capacity of the memory cell array is not affected.

FIG. 7 is a modification of the read operation in FIG. 6.

In this example, a row decoder is arranged at both ends of a memory cell array. In this case, the LM flag area is also arranged at both ends of a memory cell array.

In this case, data of a memory cell in the LM flag area at the right end of the memory cell array is read when a read error of memory cells connected to a word line driven by the row decoder on the left side and data of a memory cell in the LM flag area at the left end of the memory cell array is read when a read error of memory cells connected to a word line driven by the row decoder on the right side.

2. Application Example

The embodiment is applicable to whole nonvolatile semiconductor memories in which the word line has become long and narrow due to micropatterning. Such memories include a NAND flash memory and a NOR flash memory. The embodiment is not limited in the device structure, the read/write method, and the number of bits (2-level or multi-level) stored in one cell. For example, the embodiment is applicable to both of the shield bit line method in which read/write operations are divided into even-numbered bit lines and odd-numbered bit lines and the ABL (All bit line) method in which read/write operations are performed on all bit lines simultaneously.

An application example of the embodiment to a NAND flash memory will be described below.

Figure 8:
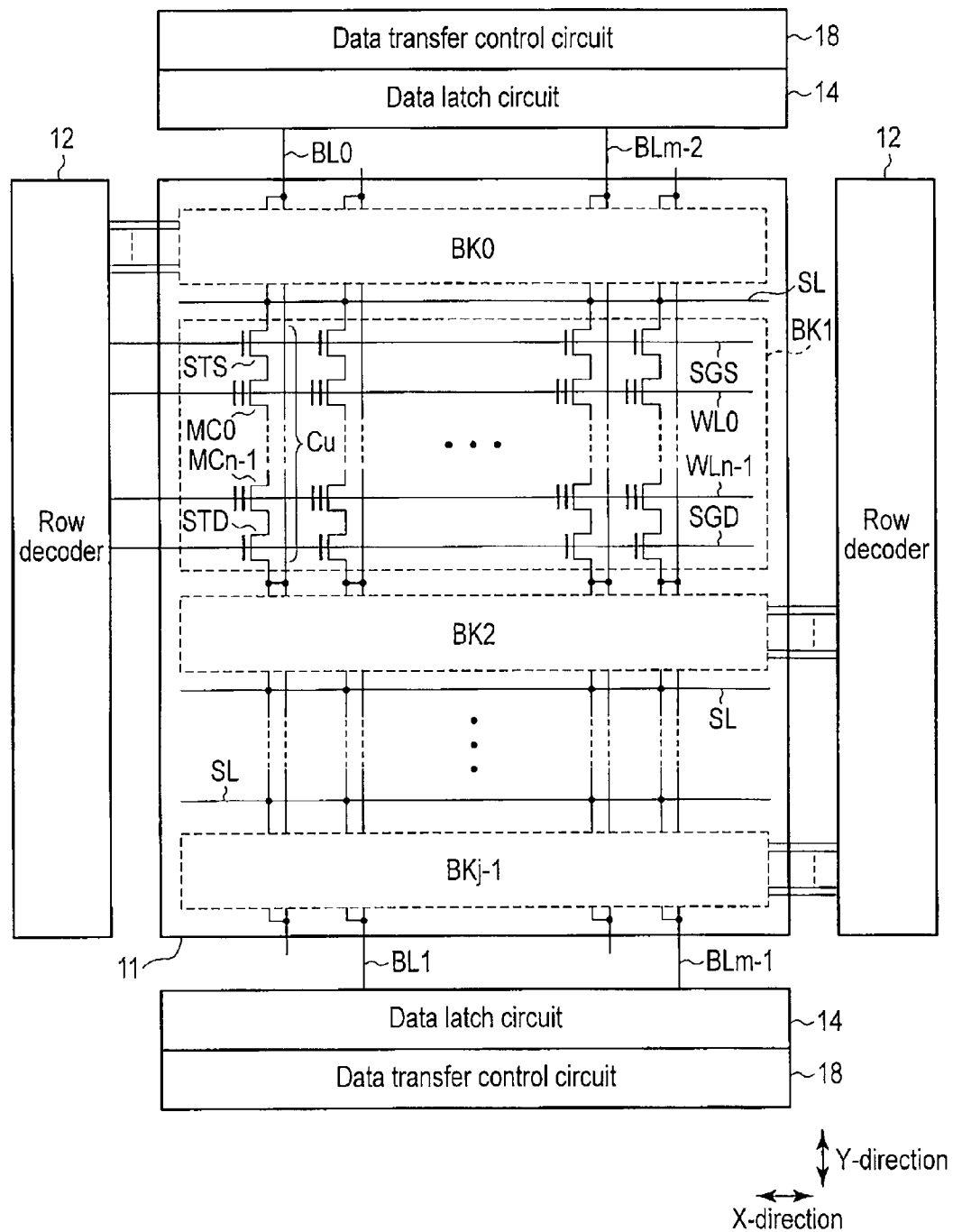
FIG. 8 is a diagram showing a NAND flash memory as an application example.

FIG. 8 shows a NAND flash memory.

Memory cell array 11 comprises, for example, j (j is a natural number equal to 2 or greater) NAND blocks BK0, BK1, . . . BKj-1 arranged side by side in the Y direction. Each of the NAND blocks BK0, BK1, . . . BKj-1 has a NAND cell unit CU.

NAND cell unit CU comprises n (n is a natural number equal to 2 or greater) memory cells MC0, . . . MCn-1 connected in series and two select gate transistors STS, STD connected to both ends with one transistor to each.

In NAND blocks BK0, BK1, . . . BKj-1, n word lines WL0, . . . WLn-1 extend in the X direction to be connected to control gates of memory cells MC0, . . . MCn-1 respectively. Two select gate lines SGS, SGD extend in the X direction to be connected to gates of two select gate transistors STS, STD respectively.

m (m is a natural number equal to 2 or greater) bit lines BL0, BL1, . . . BLm-2, BLm-1 extend in the Y direction to be connected to select gate transistor STD arranged on the drain side of NAND cell unit CU. Select gate transistor STS arranged on the source side of NAND cell unit CU is connected to source line (cell source) SL.

Row decoder 12 is arranged at ends in the X direction of memory cell array 11. In the present example, row decoder 12 is arranged at both ends in the X direction of memory cell array 11, but may be arranged at one end of both ends in the X direction of memory cell array 11.

Data latch circuit 14 and data transfer control circuit 18 are arranged at ends in the Y direction of memory cell array 11.

Data latch circuit 14 has a function to temporarily latch data for read/write operation. Data transfer control circuit 18 comprises a column decoder to control data transfer to each column in memory cell array 11 for read/write operation.

In the present example, data latch circuit 14 and data transfer control circuit 18 are each arranged at both ends in the Y direction of memory cell array 11. Such a floor plan is adopted for, for example, the ABL method in which data is read from all bit lines in memory cell array 11.

However, data latch circuit 14 and data transfer control circuit 18 may be arranged at one end of both ends in the Y direction of memory cell array 11.

Figure 9:
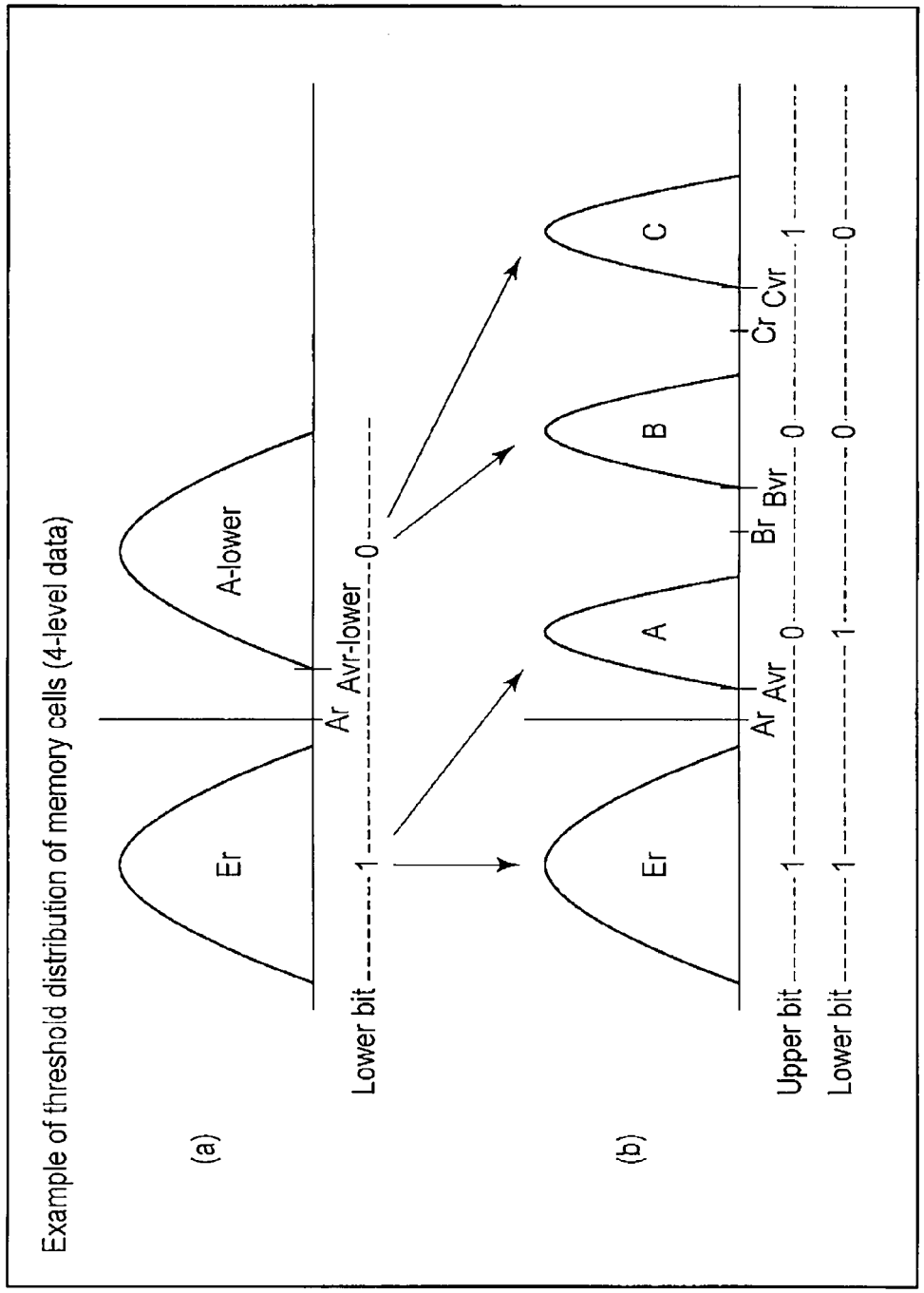
FIG. 9 is a diagram showing an example of a threshold distribution of memory cells.

FIG. 9 shows an example of a threshold distribution of memory cells.

FIG. 9A shows a state in which data has been written into the lower bit.

The initial state of a memory cell is an erased state and the threshold distribution thereof is Er. When the lower bit is "1", a write operation is inhibited and the threshold distribution of memory cells remains as Er. When the lower bit is "0", by contrast, a write operation is performed and the threshold distribution of memory cells shifts from Er to A-lower.

A verify read operation in the embodiment is performed by providing Avr-lower to the target memory cell as a read potential. A read operation in the embodiment is performed by providing Ar to the target memory cell as a read potential.

In the state in which only the lower bit has been written, the threshold distribution A-lower of memory cells of the lower bit "0" is different from the threshold distribution of memory cells in which both of the lower bit and the upper bit have been written in FIG. 9B.

This state is called a rough write or an LM (Lower middle) state because A-lower is positioned in the middle of Er, A, B, and C in FIG. 8B.

FIG. 9B shows a state in which data has been written into the lower bit and the upper bit.

When a memory cell capable of storing 4-level data is caused to store 2-level data, the 2-level data is stored as a lower bit. When a memory cell capable of storing 4-level data is caused to store 4-level data, data is first written into the lower bit and then into the upper bit.

Thus, a case when data is written into the upper bit after data is written into the lower bit will be described below.

First, a case when the lower bit is "1" will be described.

In this case, if the upper bit is "1", a write operation is inhibited and the threshold distribution of memory cells remains as Er. If the upper bit is "0", by contrast, a write operation is performed and the threshold distribution of memory cells shifts from Er to A.

Next, a case when the lower bit is "0" will be described.

In this case, if the upper bit is "1", a write operation is performed and the threshold distribution of memory cells shifts from A-lower to C. If the upper bit is "0", a write operation is performed and the threshold distribution of memory cells shifts from A-lower to B.

A verify read operation in the embodiment is performed by providing Avr, Bvr, or Cyr to the target memory cell as a read potential. A read operation in the embodiment is performed by providing Ar, Br, or Cr to the target memory cell as a read potential.

When data is written into the upper bit from the state in which data has been written into the lower bit, the amount of shift becomes smaller in the threshold distribution from Er to A, A-lower to B, and further A-lower to C.

Therefore, the spread of the threshold distribution due to a capacity coupling effect generated when data is written into the upper bit can be limited.

In LM mode, whether data stored in a memory cell as a read/write target is in the lower bit only or in both the lower bit and the upper lower is judged by using the LM flag.

Thus, the LM flag will be described below.

FIG. 10 shows details of a memory cell array core unit.

The memory cell array core unit comprises memory cell array 11, data latch circuit 14, and data transfer control circuit 18. Reference numeral 19 is a data bus.

Memory cell array 11 includes main area 11-1 in which main data (for example, file data) is stored, ECC area 11-2 in which data for data correction by an ECC (Error correct circuit) is stored, LM flag area 11-3 in which the LM flag is stored, and redundancy area 11-4 in which redundant data is stored.

Data latch circuit 14 includes first latch circuit LA-1 and second latch circuit LA-2. These two latch circuits LA-1, LA-2 are used to read/write 4-level (2-bit) data.

Data latch circuit 14-1 corresponds to main area 11-1, data latch circuit 14-2 corresponds to ECC area 11-2, data latch circuit 14-3 corresponds to LM flag area 11-3, and data latch circuit 14-4 corresponds to redundancy area 11-4.

Figure 11:
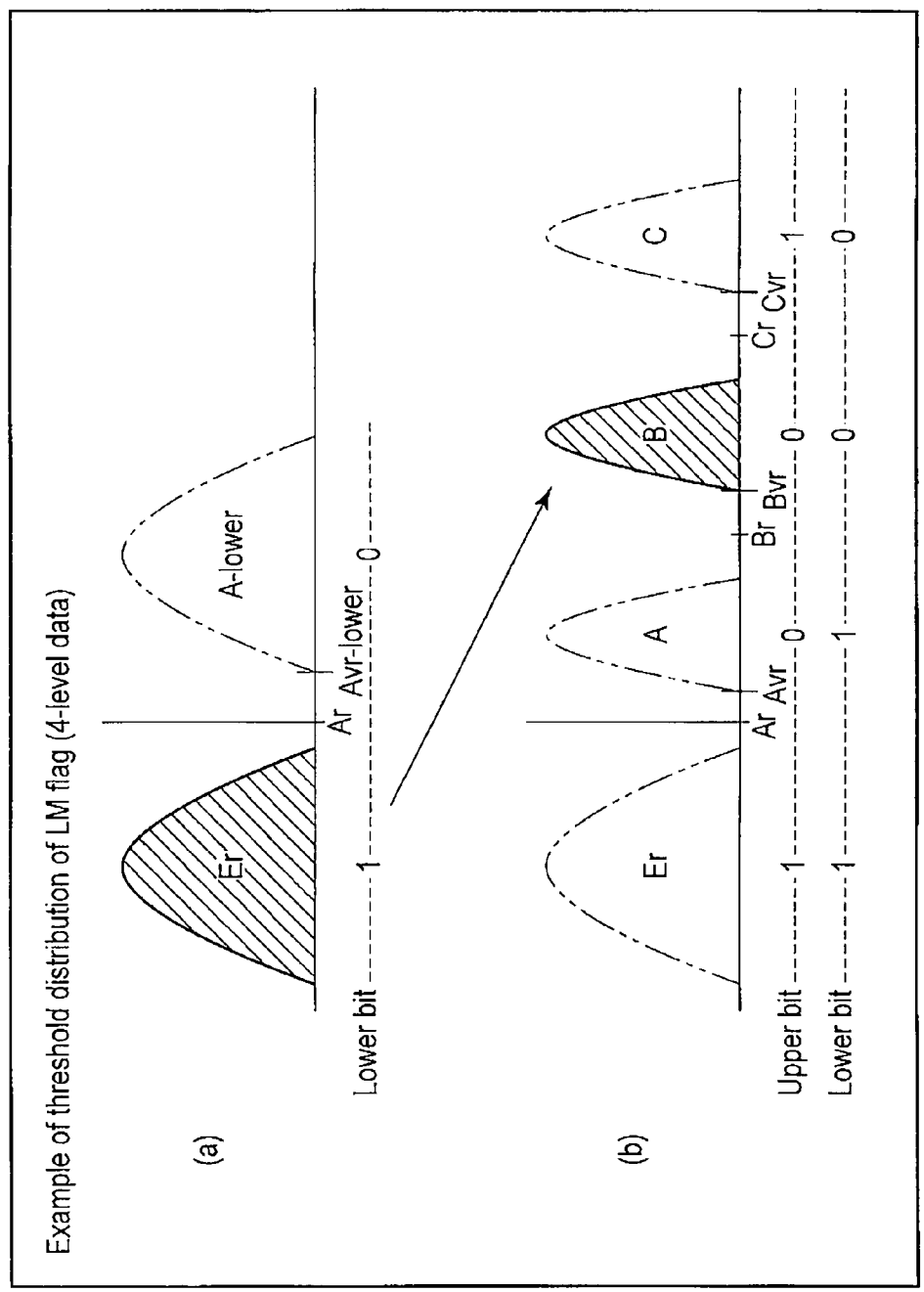
FIG. 11 is a diagram showing an example of the threshold distribution of LM flags.

FIG. 11 shows an example of the threshold distribution of LM flags.

It is assumed here that the LM flag comprises one memory cell and one flag is provided for one row (for example, one page).

First, if data has been written only into the lower bit of the memory cell in the main area, it is necessary for the LM flag to be written into the lower bit only. This is because the memory cell in the main area and the LM flag are connected to a word line common to both and are read by the same read potential.

In this case, the threshold distribution of LM flags is set to the erased state Er.

Therefore, if data stored in a memory cell is in the lower bit only, LM flag data "L", that is, the lower bit "1" is read by read potential Ar. This can be used for detection of a read error in the embodiment.

Next, if data has been written into the lower bit and the upper bit of the memory cell in the main area, it is necessary for the LM flag to be written into both the lower bit and the upper bit.

In this case, the threshold distribution of LM flags is set to written state B.

The reason therefor is that when 4-level data is read, first Br between threshold distribution A and threshold distribution B is used as a read potential to read the 4-level data to judge the value of the lower bit and it is very preferable if "H" is judged as the value of the LM flag.

Also in threshold distribution C, "H" can be judged as the value of the LM flag by using read potential Br, but it is preferable for the amount of shift from Er to be small.

Thus, the threshold distribution of LM flags when data has been written into the lower bit and the upper bit of the memory cell in the main area is set to written state B.

Therefore, when data stored in a memory cell is in both the lower bit and the upper bit, LM flag data "H", that is, the lower bit "0" is read by read potential Br. This can be used for detection of a read error in the embodiment.

Thus, the threshold distribution of LM flags becomes Er when data has been written into only the lower bit of the memory cell in the main area and becomes B when data has been written into the lower bit and the upper bit of the memory cell in the main area.

When the threshold distribution of LM flags is shifted from Er to B, it is necessary for program data to have "0" both in the lower bit and the upper bit and thus, when the upper bit is programmed, it is necessary to forcibly change the lower bit "1" read from the LM flag to "0".

3. Conclusion

According to the embodiment, it becomes possible to judge whether there is any error such as being unable to read data after a program operation before the program operation terminates by automatically performing a read operation without input of a new command after a program is normally executed.

An external controller holds program data before a program operation terminates and if an error thereof is detected, the program operation can be performed again after taking steps, for example, changing the word line by informing the external controller of the status fail. Therefore, a problem such as being unable to read stored data permanently by the user in a nonvolatile semiconductor memory will not arise.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory comprising:
a memory cell array including a selected memory cell as a target of a program operation;
a row decoder that selects a selected word line connected to the selected memory cell;
a data latch circuit that latches program data stored in the selected memory cell;
a verify circuit that judges completion/non-completion of storing of the program data in the selected memory cell; and
a control circuit that outputs status information to an external controller before the program operation terminates,
wherein the control circuit is configured to:
repeat an application of a write pulse and a verify read operation to the selected word line,
perform a read operation from the selected memory cell after the storing of the program data is judged to be completed by the verify circuit, and
output the status information indicating that the program operation has passed to the external controller when data read by the read operation and the program data match and the status information indicating that the program operation has failed to the external controller when both do not match,
wherein the data latch circuit continues to latch the program data even after the storing of the program data is judged to be completed by the verify circuit.

2. The memory of claim 1, wherein the external controller changes the selected memory cell and the selected word line and then restarts the program operation, when the external controller receives the status information indicating that the program operation has failed.

3. The memory of claim 1, wherein the selected memory cell is a memory cell closest to a tip of the selected word line, among memory cells connected to the selected word line.

4. The memory of claim 1, wherein the selected memory cell is each of memory cells connected to the selected word line.

5. The memory of claim 1, wherein the control circuit judges that there is a read error due to an increase in resistance of the selected word line, when the data read by the read operation and the program data do not match.

6. A nonvolatile semiconductor memory comprising:
a memory cell array including a selected memory cell as a target of a program operation;
a row decoder that selects a selected word line connected to the selected memory cell;
a data latch circuit that latches program data stored in the selected memory cell;
a verify circuit that judges completion/non-completion of storing of the program data in the selected memory cell; and
a control circuit that outputs status information to an external controller before the program operation terminates,
wherein the control circuit is configured to:
repeat an application of a write pulse and a verify read operation to the selected word line, perform a read operation from a failure judged cell connected to the selected word line other than the selected memory cell after the storing of the program data is judged to be completed by the verify circuit, and
output the status information indicating that the program operation has passed to the external controller when data read by the read operation and an expected value match and the status information indicating that the program operation has failed to the external controller when both do not match,
wherein the failure judged cell is connected to a tip portion of the selected word line.

7. The memory of claim 6, wherein the external controller changes the selected memory cell and the selected word line and then restarts the program operation, when the external controller receives the status information indicating that the program operation has failed.

8. The memory of claim 6, wherein the failure judged memory cell is a memory cell closest to a tip of the selected word line, among memory cells connected to the selected word line.

9. The memory of claim 6, wherein the failure judged cell is each of memory cells connected to a tip portion of the selected word line.

10. The memory of claim 6, wherein the control circuit judges that there is a read error due to an increase in resistance of the selected word line, when the data read by the read operation and the program data do not match.

11. A nonvolatile semiconductor memory comprising:
a memory cell array including a selected memory cell as a target of a program operation;
a row decoder that selects a selected word line connected to the selected memory cell;
a data latch circuit that latches program data stored in the selected memory cell;
a verify circuit that judges completion/non-completion of storing of the program data in the selected memory cell; and
a control circuit that outputs status information to an external controller before the program operation terminates,
wherein the control circuit is configured to:
repeat an application of a write pulse and a verify read operation to the selected word line,
perform a read operation from first and second failure judged cells connected to the selected word line other than the selected memory cell after the storing of the program data is judged to be completed by the verify circuit, and
output the status information indicating that the program operation has passed to the external controller when data read by the read operation and an expected value match and the status information indicating that the program operation has failed to the external controller when both do not match, wherein the first failure judged cell is connected to a tip portion of the selected word line and the second failure judged cell is connected to a center portion of the selected word line.

12. The memory of claim 11, wherein the external controller changes the selected memory cell and the selected word line and then restarts the program operation, when the external controller receives the status information indicating that the program operation has failed.

13. The memory of claim 11, wherein the control circuit outputs the status information indicating that the program operation has passed to the external controller when data read from the first and second failure judged cells and the expected value match, and the control circuit outputs the status information indicating that the program operation has failed to the external controller when data read from the first and second failure judged cells and the expected value do not match.

14. The memory of claim 11, wherein the control circuit judges that there is a read error due to an increase in resistance of the selected word line between the first and second failure judged cells, when data read from the first failure judged cell and the expected value do not match and data read from the second failure judged cell and the expected value match.

15. The memory of claim 14, wherein the external controller outputs the status information indicating that the program operation has failed regarding memory cells between the first and second failure judged cells and the status information indicating that the program operation has passed regarding memory cells present on a side of the row decoder from the second failure judged cell.

16. A nonvolatile semiconductor memory comprising:
a memory cell array including a selected memory cell as a target of a program operation;
a row decoder that selects a selected word line connected to the selected memory cell;
a data latch circuit that latches program data stored in the selected memory cell;
a verify circuit that judges completion/non-completion of storing of the program data in the selected memory cell; and
a control circuit that outputs status information to an external controller before the program operation terminates,
wherein the control circuit is configured to:
repeat an application of a write pulse and a verify read operation to the selected word line,
perform a read operation from a failure judged cell connected to the selected word line other than the selected memory cell after the storing of the program data is judged to be completed by the verify circuit, and
output the status information indicating that the program operation has passed to the external controller when data read by the read operation and an expected value match and the status information indicating that the program operation has failed to the external controller when both do not match,
wherein the failure judged cell store s data indicating which of n (n is a natural number equal to 2 or greater) bits the program data represents when the selected memory cell store s n bits.

17. The memory of claim 16, wherein the external controller changes the selected memory cell and the selected word line and then restarts the program operation, when the external controller receives the status information indicating that the program operation has failed.

18. The memory of claim 16, wherein the failure judged memory cell is a memory cell closest to a tip of the selected word line, among memory cells connected to the selected word line.

19. The memory of claim 16, wherein the failure judged cell is each of memory cells connected to a tip portion of the selected word line.

20. The memory of claim 16, wherein the control circuit judges that there is a read error due to an increase in resistance of the selected word line, when the data read by the read operation and the program data do not match.

* * * * *